United States Patent
Dosho et al.

(10) Patent No.: US 6,825,712 B2
(45) Date of Patent: Nov. 30, 2004

(54) FILTER CIRCUIT, FRONT END OF COMMUNICATION SYSTEM INCLUDING THE FILTER CIRCUIT, AND COMMUNICATION DEVICE INCLUDING THE SAME

(75) Inventors: Shiro Dosho, Osaka (JP); Takashi Morie, Osaka (JP); Hitoshi Kobayashi, Osaka (JP); Norihide Kinugasa, Kyoto (JP); Masaomi Toyama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/385,427

(22) Filed: Mar. 12, 2003

(65) Prior Publication Data

US 2003/0184367 A1 Oct. 2, 2003

(30) Foreign Application Priority Data

Mar. 29, 2002 (JP) .................................... 2002-097531

(51) Int. Cl.[7] .............................................. H03K 5/00
(52) U.S. Cl. ...................................... 327/552; 327/558
(58) Field of Search ................................. 327/552–559

(56) References Cited

U.S. PATENT DOCUMENTS 5,963,088 A * 10/1999 Czarnul et al. ............... 330/69
6,316,992 B1 * 11/2001 Miao et al. ..................... 330/2
6,317,016 B1 * 11/2001 Kuo .............................. 333/215

OTHER PUBLICATIONS

J.P. Cornil, et al. "A 0.5μm CMOS ADSL Analog Front–End IC" IEEE International Solid–State Circuits Conference (Feb. 16, 1999) pp. 238–239.

* cited by examiner

*Primary Examiner*—Dinh T. Le
(74) *Attorney, Agent, or Firm*—McDermott Will & Emery LLP

(57) ABSTRACT

In a front end that has a filter circuit and is used for a communication system having an asymmetric communication channel in which upstream and downstream data rates are different, a filter circuit for received signals, which is for filtering received signals, and a filter circuit for transmitted signals, which is for filtering transmitted signals, are provided. The filter circuit for received signals has an amplifier block including a plurality of amplifiers, a capacitor block including a plurality of capacitors and being connected to the plurality of amplifiers included in the amplifier block, and a first and a second resistor blocks each including a plurality of resistors. Either one of the first or the second resistor block is selectively switched so as to be connected to the amplifier block by a resistor block-switching circuit. The circuit scale is reduced since only one amplifier block and one capacitor block are commonly used for two kinds of filter circuits.

12 Claims, 9 Drawing Sheets

FILTER CIRCUIT, FRONT END OF COMMUNICATION SYSTEM INCLUDING THE FILTER CIRCUIT, AND COMMUNICATION DEVICE INCLUDING THE SAME

BACKGROUND OF THE INVENTION

The present invention relates to filter circuits suitable for use in communication systems having asymmetric communication channels such as ADSL communication. The invention also relates to front ends having the filter circuits and communication devices having the same.

In communication systems having asymmetric communication channels, such as ADSL communication, the communication channels are asymmetric such that the downstream data rate is fast whereas the upstream data rate is relatively slow. Asymmetric communication systems have received considerable attention as they can achieve high-speed communication at low cost. Cost reduction of the equipment for realizing such communication systems has also become an issue. In addition, in order to reduce the size of the front end, which is a transmitting and receiving section in such a communication system, it has been required to reduce the circuit area of the front end.

FIG. 6 is a block diagram showing the configuration of a conventional front end in an asymmetric communication system, which serves as a transmitting and receiving section. The front end is provided with a signal receiving terminal 51, and communication signals received at the signal receiving terminal 51 are input to a receiver 52.

The front end is further provided with a first to a third filter circuits 53, 54, and 55. The first filter circuit 53 and the third filter circuit 55 have a high cutoff frequency, whereas the second filter circuit 54 has a low cutoff frequency.

The output from the receiver 52 is filtered by either one of the first filter circuit 53 or the third filter circuit 55, is thereafter converted in to a digital signal by a receiving-side A-D converter 58, and is then output from a digital signal output terminal 59 to a digital processing section, which is not shown in the drawing.

The digital signal processed in the digital processing section is input from a digital signal input terminal 61, is thereafter converted into an analog signal by a transmitting-side D-A converter 62, and is then filtered by either one of the second filter circuit 54 or the third filter circuit 55. The filtered analog signal is transmitted from a signal-transmitting terminal 65 by a driver 64.

The output from the receiver 52 is supplied to the first filter circuit 53 directly, and is also supplied to the third filter 55 via an input switching circuit 57. The input switching circuit 57 is also supplied with the output from the transmitting-side D-A converter 62.

The output from the first filter circuit 53 is supplied to the A-D converter 58 via a first output switching circuit 56. The first output switching circuit 56 is also supplied with the output from the third filter circuit 55.

The output from the transmitting-side D-A converter 62 is supplied to the third filter circuit 55 via the input switching circuit 57, as described above, and is also supplied to the second filter circuit 54 directly. The output from the second filter circuit 54 is supplied to the driver 64 via a second output switching circuit 63. The second output switching circuit 63 is also supplied with the output from the third filter circuit 55.

In the front end thus configured, according to switching operations of the input switching circuit 57 and the first output switching circuit 56, the output from the receiver 52 is filtered by either one of the first filter circuit 53 or the third filter circuit 55, which is thereafter supplied to the A-D converter 58.

The output from the transmitting-side D-A converter 62 is filtered by either one of the second filter circuit 54 or the third filter circuit 55 according to switching operations of the input switching circuit 57 and the second output switching circuit 63, which is thereafter supplied to the driver 64.

The third filter circuit 55 is selected by the input switching circuit 57 so that it is used for a filtering process for only one of the received signals or the transmitted signals.

FIG. 7 shows a block diagram schematically illustrating the configuration of a filter circuit used for the first to third filter circuits 53 to 55. Normally, a filter circuit 70 is constructed such that a resistor block 72 that includes a plurality of resistors is connected to an amplifier block 73 that includes a plurality of amplifiers by a connector bus 76, and the amplifier block 73 is connected to a capacitor block 74 that includes a plurality of capacitors by a connector bus 77.

The signals received at a receiving terminal 71 connected to the resistor block 72 are filtered by the filter circuit 70, and thereafter is output from an output terminal 75 connected to the amplifier block 73 to the outside of the filter circuit 70.

FIG. 8 is a circuit diagram showing the detailed configuration of the filter circuit 70. The filter circuit 70 is a fourth-order filter circuit, and the amplifier block 73 is provided with four amplifiers 73a. The capacitor block 74 likewise has four capacitors 74a. Each of the capacitors 74a comprises two capacitor elements. The resistor block 72 has four resistors 72a, and each of the resistors 72a comprises a plurality of resistor elements. An amplifier 73a in the amplifier block 73 that is positioned at the rightmost side in the figure is connected to an output terminal 75 of the fourth-order filter circuit 70.

Because this conventional filter circuit 70 has the resistor block 72, the amplifier block 73, and the capacitor block 74 as shown in FIG. 8, it requires a large mounting area. Particularly, the amplifier block 73 and the capacitor block 74, which include a plurality of amplifiers 73a and a plurality of capacitor 74a, respectively, have large areas and therefore necessitate a larger mounting area than the resistor block 72, which includes a plurality of resistors 72a. As a result, the front end having three filter circuits 53 to 55 as shown in FIG. 6 inevitably requires a considerably large circuit scale, which is undesirable.

In addition, it is feared that distortion characteristic of the signals degrades because, for the purpose of switching of the three filter circuits 53 to 55, the input switching circuit 57 and the first and the second output switching circuit 56 and 63 are provided in the signal communication channel.

SUMMARY OF THE INVENTION

It is an object of the present invention to provide a filter circuit in which the circuit scale can be reduced and the signal quality improved, and to provide a front end for an asymmetric communication system in which the filter circuit is incorporated, as well as a communication device incorporating the same.

In order to achieve the foregoing and other objects, the invention takes advantage of the fact that, in cases where a plurality of kinds of filter circuits are to be selectively formed, it is possible to configure amplifier blocks having the same value and capacitor blocks having the same value if the resistance values of the resistor blocks in the filter circuits are adjusted, although the values of the amplifier blocks and the values of the capacitor blocks incorporated in the respective filter circuits are different among the amplifier blocks and the capacitor blocks, respectively; and accordingly, in all of the filter circuits, one amplifier block and one capacitor block are commonly used for the amplifier block and the capacitor block that constitute each of the filter circuits, in order to reduce the mounting area.

More specifically, the present invention provides a filter circuit comprising: an amplifier block including a plurality of amplifiers; a capacitor block including a plurality of capacitors, the plurality of capacitors being connected to the plurality of amplifiers included in the amplifier block respectively; a plurality of resistor blocks each including a plurality of resistors; and a resistor block-switching circuit for selecting one of the plurality of resistor blocks and connecting the plurality of resistors included in the selected resistor block to the plurality of amplifiers included in the amplifier block.

Preferably, in the above-described filter circuit, the resistor block-switching circuit is arranged at signal input sides of the plurality of amplifiers included in the amplifier block, the signal input sides being the virtual ground point thereof.

Preferably, in the above-described filter circuit, a first resistor block of the plurality of resistor blocks has a plurality of resistors, the number of which is different from the number of resistors included in a second resistor block of the plurality of resistor blocks; a first filter circuit in which the first resistor block is connected to the amplifier block constitutes a filter circuit having a first ordinal number; and a second filter circuit in which the second resistor block is connected to the amplifier block constitutes a filter circuit having a second ordinal number.

Preferably, in the above-described filter circuit, one of the plurality of amplifiers in the amplifier block that is an output of the first filter circuit is connected to a pair of output terminals of the filter circuit having the first ordinal number; and one of the plurality of amplifiers in the amplifier block that is an output of the second filter circuit is connected to a pair of output terminals of the filter circuit having the second ordinal number.

Preferably, in the above-described filter circuit, an output terminal-switching circuit for selecting one of the pair of output terminals of the filter circuit of the first ordinal number and the pair of output terminals of the filter circuit of the second ordinal number.

In accordance with another aspect, the present invention also provides a front end of a communication system, the front end having: a filter circuit that filters signals, the filter circuit comprising: an amplifier block including a plurality of amplifiers; a capacitor block including a plurality of capacitors, the plurality of capacitors being connected to the plurality of amplifiers included in the amplifier block respectively; a plurality of resistor blocks each including a plurality of resistors; and a resistor block-switching circuit for selecting one of the plurality of resistor blocks and connecting the plurality of resistors included in the selected resistor block to the plurality of amplifiers included in the amplifier block.

Preferably, in the above-described front end of a communication system, the communication system is an asymmetric communication system in which an upstream data rate and a downstream data rate are different from each other.

Preferably, in the above-described front end of a communication system, the asymmetric communication system is an ADSL communication system.

Preferably, in the above-described front end of a communication system, the filter circuit comprises a first filter circuit for received signals and a second filter circuit for transmitted signals; and the first filter circuit and the second filter circuit are not electrically connected by signal wiring and a switch circuit, the first and the second filter circuits being electrically separated from each other.

The present invention also provides a communication device comprising: the foregoing front end; a signal processing circuit for digitally processing a signal received by the front end and a signal transmitted from the front end; and a converter circuit for converting the signal that has been digitally processed by the signal processing circuit into an analog signal and converting an analog signal that is input from a predetermined voice communication terminal to the signal processing circuit into a digital signal.

As described above, the present invention does not prepare a plurality of filter circuits each having an amplifier block, a capacitor block, and a resistor block. Instead, only one amplifier block and one capacitor block are provided while a plurality of resistor blocks are provided, and any one of the plurality of resistor blocks is selected by switching so as to be connected to the amplifier block and the capacitor block. Therefore, only one amplifier block and one capacitor block are sufficient to construct a plurality of filter circuits having differing cutoff frequencies, and thus, the circuit scale is effectively reduced.

Moreover, according to the present invention, because the resistor block-switching circuit is arranged at each signal input side of a plurality of amplifiers, which is the virtual ground point thereof, the existence of the switching circuit does not affect the signal filtering process; therefore, crosstalk or the like can be prevented and occurrences of signal distortion are reduced, whereby the signal characteristic is improved.

Furthermore, according to the present invention, it is possible to change filter circuits having differing filter orders.

In addition, according to the present invention, the first filter circuit for received signals and the second filter circuit for transmitted signals are electrically separated from each other. Therefore, it is not necessary to electrically connect the signal-receiving side and the signal-transmitting side using signal wiring, switch circuits, or the like, and consequently, the layout configuration becomes simple.

DETAILED DESCRIPTION OF THE INVENTION

Hereinbelow, preferred embodiments of the present invention are described with reference to the appended drawings.

Embodiment 1

Figure 1:
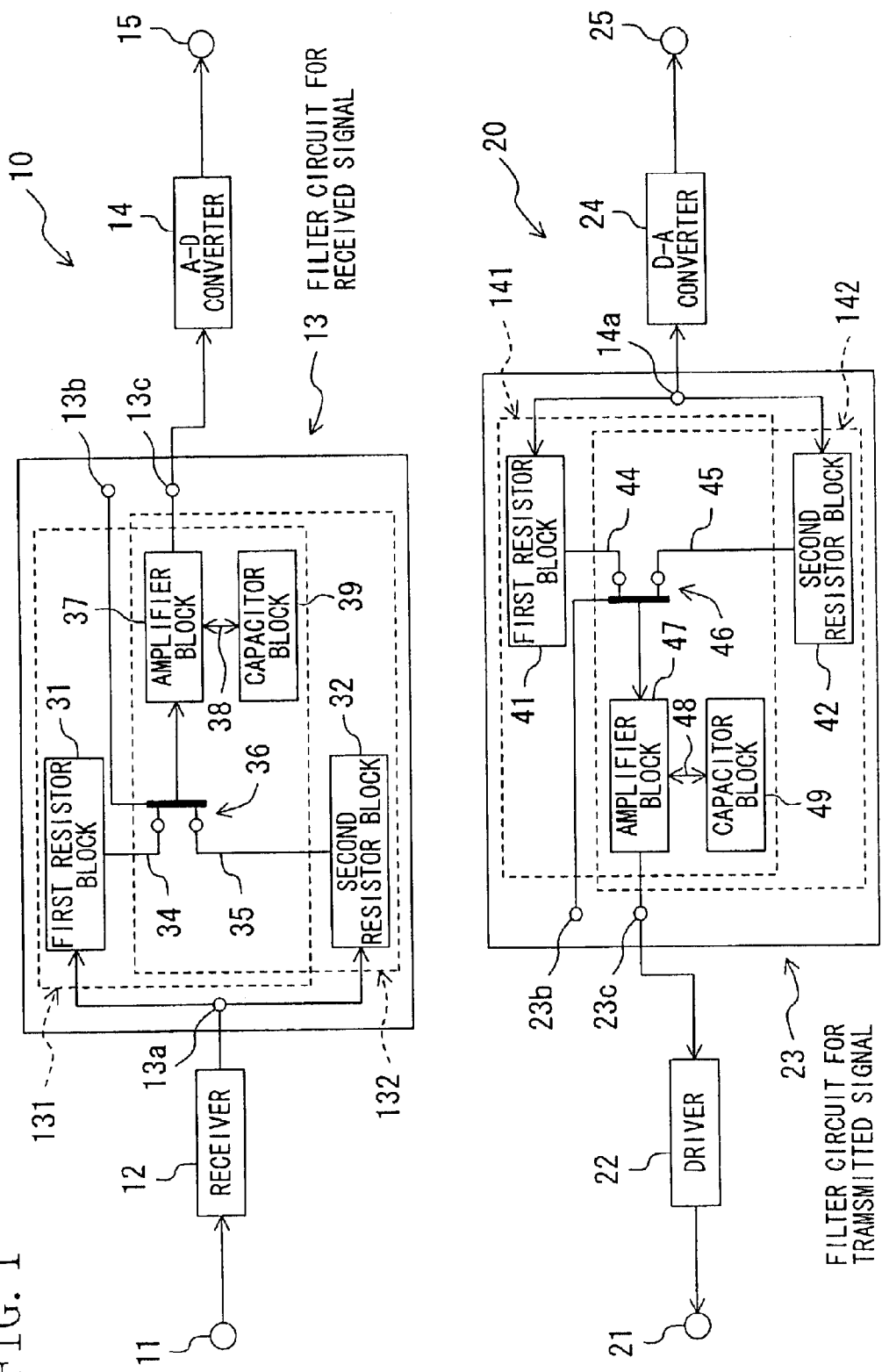
FIG. 1 is a block diagram showing a front end of a communication system according to Embodiment 1 of the present invention.

FIG. 1 is a block diagram schematically showing the overall configuration of a front end in a communication system according to one embodiment of the present invention. This front end is used for an asymmetric communication system, such as ADSL (Asymmetric Digital Subscriber Line), in which the upstream data rate and the downstream data rate are different from one another.

The front end shown in FIG. 1 has a receiving signal-processing section 10 that processes a received communication signal and a transmission signal-processing section 20 that processes a communication signal to be transmitted. The signal communication channel of the receiving signal-processing section 10 and the signal communication channel of the transmission signal-processing section 20 have different data rates, and are thus asymmetric.

The receiving signal-processing section 10 has a signal receiving terminal 11 in which a communication signal is received, and a receiver 12 is connected to the signal receiving terminal 11. The signal that is received by the receiver 12 via the signal receiving terminal 11 is supplied to a filter circuit 13 for received signals. The received signal is filtered by the filter circuit 13 for received signals and is then supplied to an AD converter 14. The signal is then converted into a digital signal by the A-D converter 14, and is thereafter output from a digital signal output terminal 15 to a digital processing section, which is not shown in the figure.

The transmission signal-processing section 20 has a digital signal input terminal 25 that receives the signal that has been converted into a digital signal and is output from the digital processing section. The digital signal that is input to the digital signal input terminal 25 is then converted into an analog signal by a D-A converter 24 and is thereafter supplied to a filter circuit 23 for transmitted signals. The filter circuit 23 for transmitted signals filters the analog signal that is output from the D-A converter 24, and outputs the filtered analog signal to a driver 22. The driver 22 transmits the filtered analog signal from a signal-transmitting terminal 21.

Figure 2:
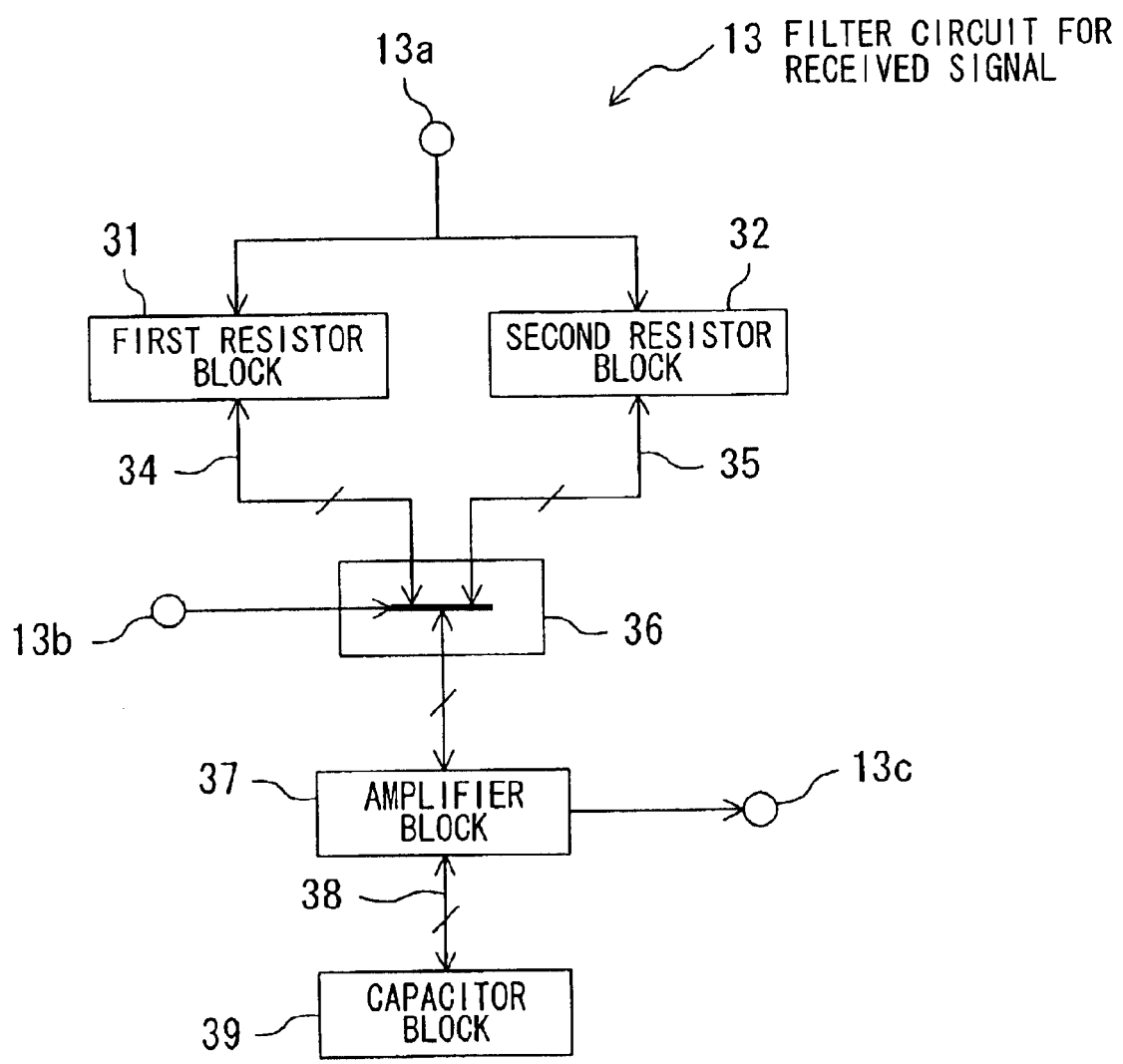
FIG. 2 is a block diagram showing the configuration of a filter circuit for received signals used in the front end.

FIG. 2 is a block diagram schematically showing the internal configuration of the filter circuit 13 for received signals, which is provided in the receiving signal-processing section 10. The filter circuit 13 for received signals has a first resistor block 31 and a second resistor block 32, and its input terminal 13a is supplied with the output from the receiver 12. Each of the first resistor block 31 and the second resistor block 32 includes four resistors, as will be described later, and the resistance value of the first resistor block 31 is different from the resistance value of the second resistor block 32.

The first resistor block 31 and the second resistor block 32 are connected to a resistor block-switching circuit 36 via a first connector bus 34 and a second connector bus 35, respectively. The resistor block-switching circuit 36 selects one of the connector buses 34 and 35, and connects the selected connector bus to an amplifier block 37.

The resistor block-switching circuit 36 is provided with a mode-selecting terminal 13b. To the mode-selecting terminal 13b, a mode-selecting signal is input for selecting one of the first connector bus 34 and the second connector bus 35. Thus, either one of the first resistor block 31 or the second resistor block 32 is selectively connected to the amplifier block 37 by the resistor block-switching circuit 36.

The amplifier block 37 is connected to a capacitor block 39 by a third connector bus 38. The amplifier block 37 is provided with an output terminal 13c. From the output terminal 13c, the output from the filter circuit 13 for received signals is output to the A-D converter 14.

In the filter circuit 13 for received signals thus configured, the resistor block-switching circuit 36 is switched by the mode-selecting signal that is input from the mode-selecting terminal 13b. Consequently, the amplifier block 37 connected to the capacitor block 39 is switched between a state in which it is connected to the first resistor block 31 vita the first connector bus 34 and a state in which it is connected to the second resistor block 32 via the second connector bus 35. Thus, as shown in FIG. 1, the filter circuit 13 for received signals is switched between a state in which a first filter circuit 131 is formed and a state in which a second filter circuit 132 is formed. The first filter circuit 131 is formed by the first resistor block 31, the amplifier block 37, and the capacitor block 39, and has a predetermined high cutoff frequency. The second filter circuit 132 is formed by the second resistor block 32, the amplifier block 37, and the capacitor block 39. The second filter circuit 132 has a predetermined high cutoff frequency that is different from the cutoff frequency of the first filter circuit 131.

Likewise, in the filter circuit 23 for transmitted signals, a first resistor block 41 and a second resistor block 42 are connected to a resistor block-switching circuit 46 via a first connector bus 44 and a second connector bus 45, respectively, as shown in FIG. 1. The resistor block-switching circuit 46 is switched by a mode-selecting signal that is input from a mode-selecting terminal 23b so that either one of the first resistor block 41 or the second resistor block 42 is connected to an amplifier block 47 via the first connector bus 44 or the second connector bus 45, respectively. To the amplifier block 47, a capacitor block 49 is connected via a third connector bus 48. From an output terminal 23c disposed in the amplifier block 47, the output of the filter circuit 23 for transmitted signals is output to the driver 22.

In the above-described filter circuit 23 for transmitted signals as well, the resistor block-switching circuit 46 is switched by the mode-selecting signal that is input from the mode-selecting terminal 23b in a similar manner as in the filter circuit 13 for received signals; as a consequence, the amplifier block 47 connected to the capacitor block 49 is switched between a state in which it is connected to the first resistor block 41 via the first connector bus 44 and a state in which it is connected to the second resistor block 42 via the second connector bus 45. Thus, the filter circuit 23 for transmitted signals is switched between a first filter circuit 141 and a second filter circuit 142. The first filter circuit 141 is formed by the first resistor block 41, the amplifier block 47, and the capacitor block 49, and has a predetermined low cutoff frequency. The second filter circuit 142 is formed by the second resistor block 42, the amplifier block 47, and the capacitor block 49. The first filter circuit 141 has a predetermined low cutoff frequency that is different from cutoff frequency of the second filter circuit 142.

Figure 6:
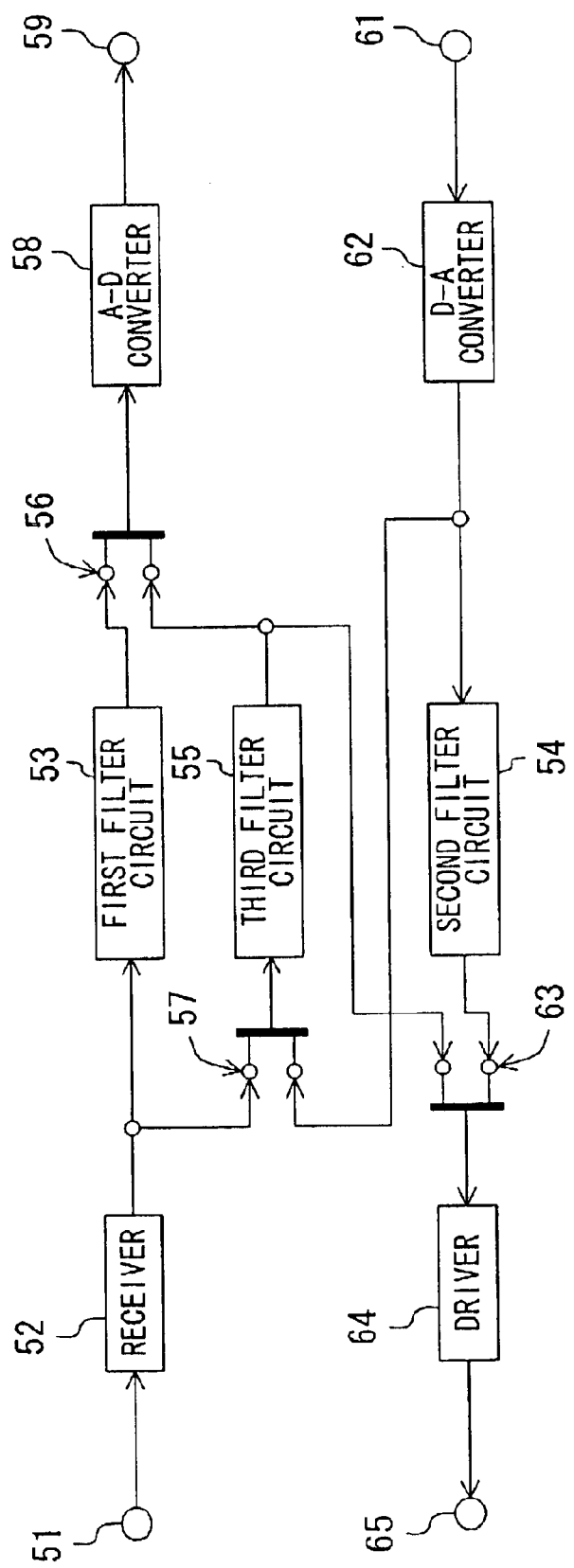
FIG. 6 is a block diagram schematically showing the configuration of a conventional front end in a communication system.
Figure 7:
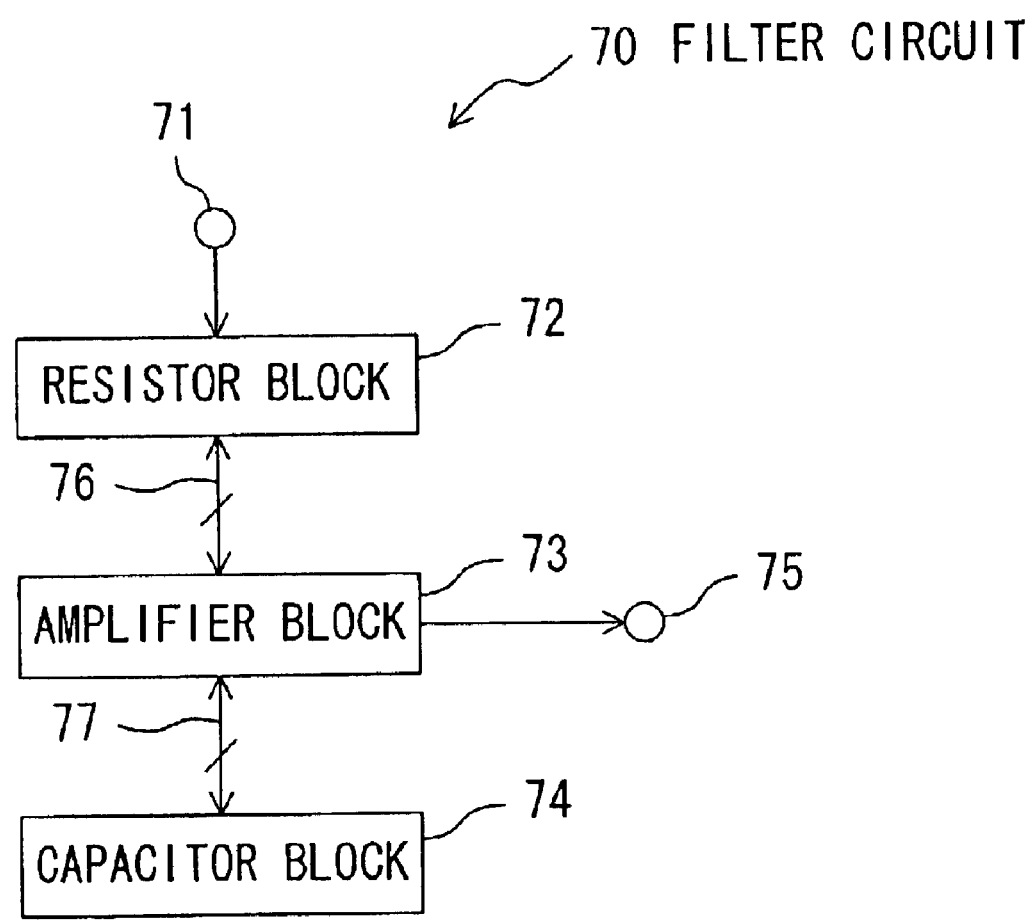
FIG. 7 is a block diagram schematically showing the configuration of a filter circuit used in the front end.
Figure 8:
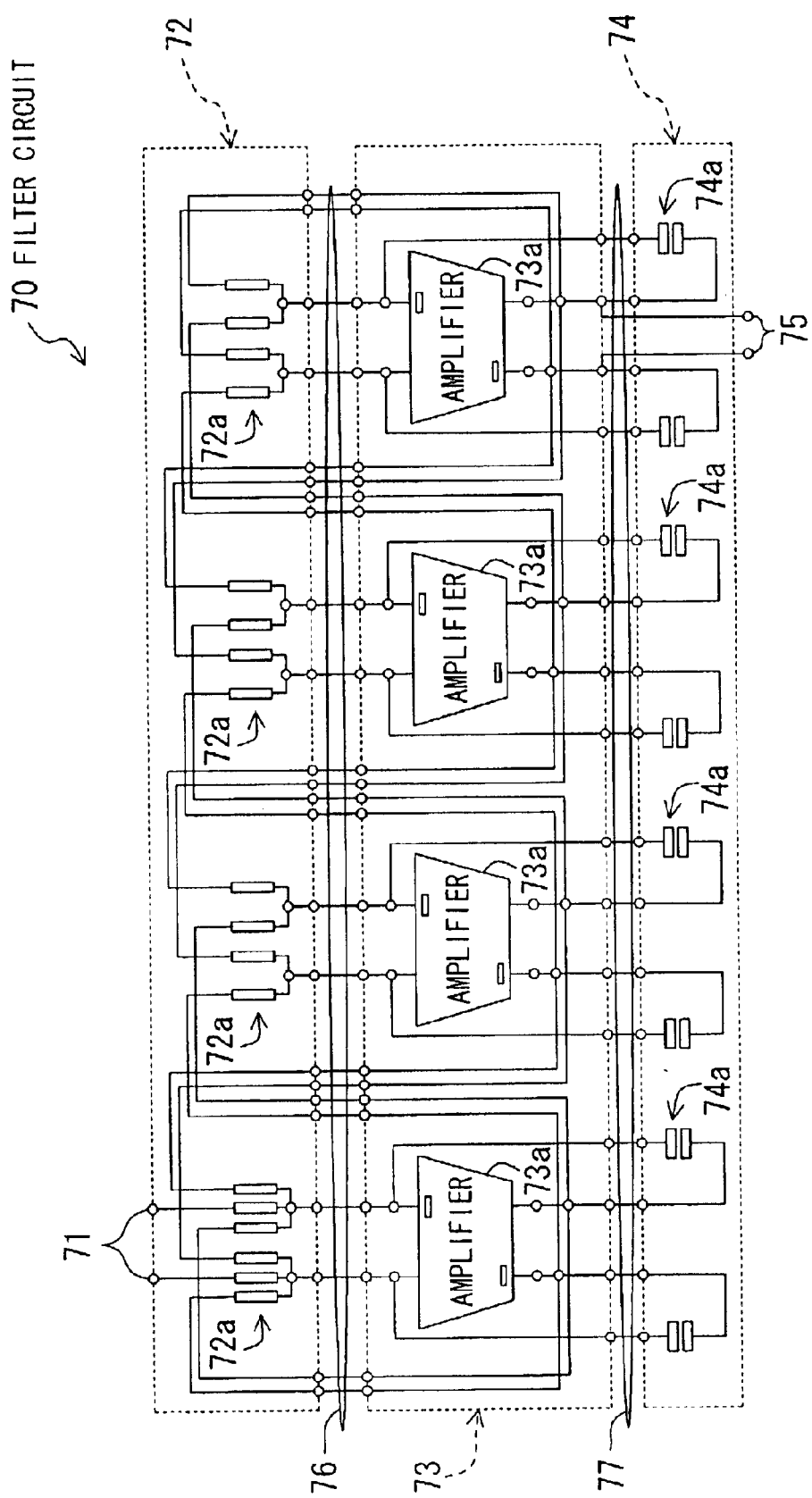
FIG. 8 is a circuit diagram showing the detailed configuration of the filter circuit.

Thus, as will be appreciated from the comparison between FIG. 1 and FIG. 6, the filter circuit 13 for received signals and the filter circuit 23 for transmitted signals have a configuration such that they are electrically separated from each other, and this is unlike the conventional configuration shown in FIG. 6 in which the signal-receiving side and the signal-transmitting side are electrically connected via signal cables, switches, or the like.

Figure 3:
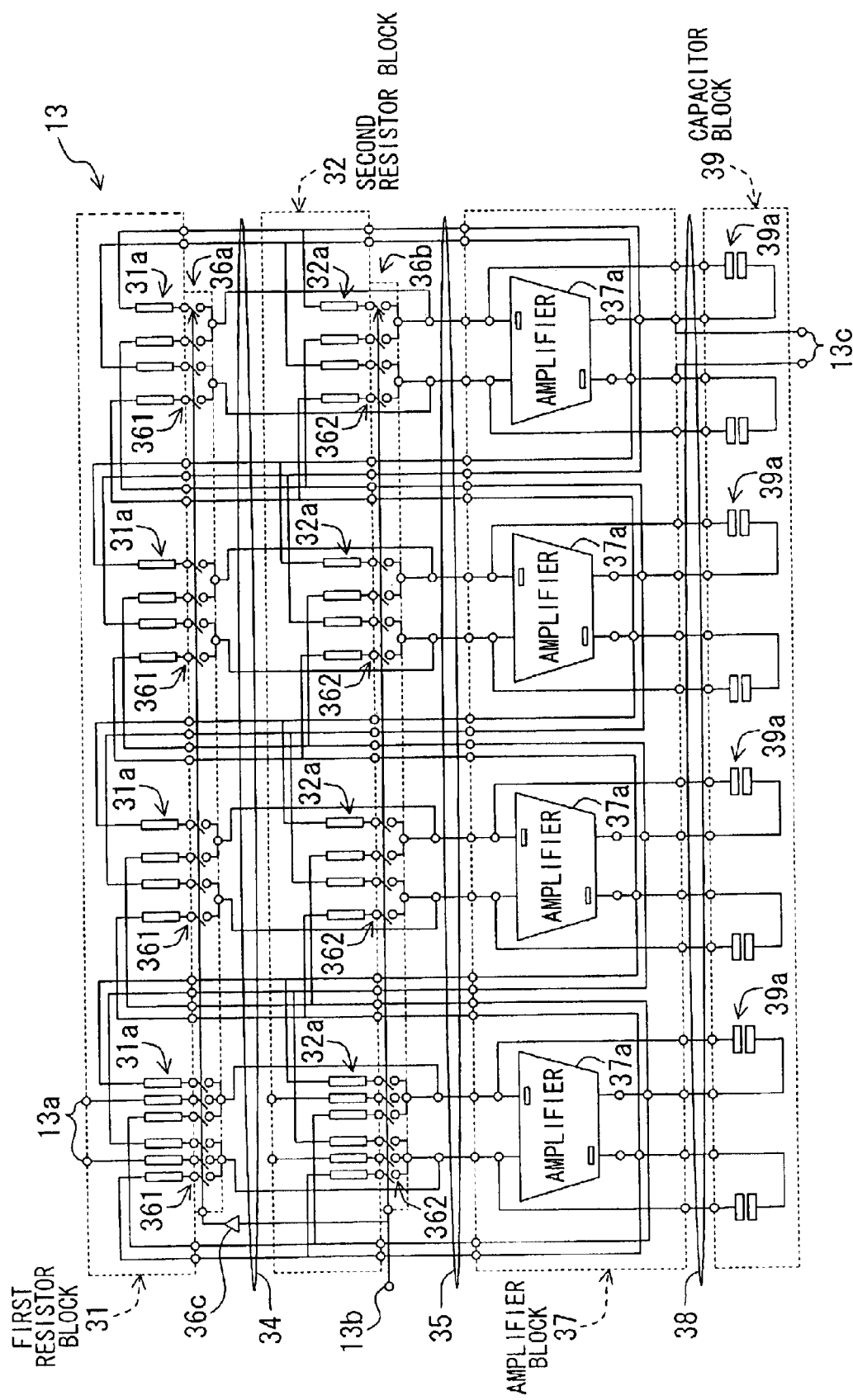
FIG. 3 is a circuit diagram showing the detailed configuration of the filter circuit for received signals.

Next, a specific configuration of the filter circuit 13 for received signals is shown in FIG. 3. The filter circuit 13 for received signals is configured as a fourth-order filter circuit. In this filter circuit 13, the first resistor block 31 comprises a plurality of (four in the figure) resistors 31a. The second resistor block 32 also comprises a plurality of (four) resistors 32a. Each of these resistors 31a and 32a comprises a plurality of resistor elements. Likewise, the amplifier block 37 comprises a plurality of (four) amplifiers 37a and the capacitor block 39 comprises a plurality of (four) capacitors 39a. Each of the capacitors 39a comprises two capacitor elements. These four resistors 31a, four resistors 32a, four amplifiers 37a, and four capacitors 39a are arranged to be lined up in this order.

The four resistors 31a of the first resistor block 31 are respectively connected to a plurality of (four) switches 361 of a first switch block 36a that constitutes the resistor block-switching circuit 36. Each of these switches 361 comprises the same number of switch elements as the number of the resistor elements that constitute the respective resistors 31a. The first switch block 36a is disposed between the first resistor block 31 and the second resistor block 32, and the switches 361 of the first switch block 36a are respectively connected to the four amplifiers 37a of the amplifier block 37 via the first connector bus 34. The switches 361 of the first switch block 36a are configured such that they can be collectively turned on/off according to an inverted signal of the mode-selecting signal that is input from the mode-selecting terminal 13b and inverted by a signal inverting circuit 36c.

Likewise, the four resistors 32a of the second resistor block 32 are respectively connected to a plurality of (four) switches 362 of the second switch block 36b that constitute the resistor block-switching circuit 36. Each of these switches 362 comprises the same number of switch elements as the number of the resistor elements that constitute the respective resistors 32a. The second switch block 36b is disposed between the second resistor block 32 and the amplifier block 37, and the switches 362 of the second switch block 36b are respectively connected to the four amplifiers 37a of the amplifier block 37 via the second connector bus 35. The switches 362 of the second switch block 36a are configured such that they can be collectively turned on/off according to the mode-selecting signal that is input from the mode-selecting terminal 13b.

While the switches 362 of the second switch block 36b are thus collectively turned on/off by the mode-selecting signal, the switches 361 of the first switch block 36a are collectively turned off/on by the inverted signal of the mode-selecting signal in a reverse manner to the second switch block 36b. Thus, the switches 361 of the first switch block 36a are controlled such that they are off when the switches 362 of the second switch block 36b are on, whereas the switches 361 of the first switch block 36a are controlled such that they are on when the switches 362 of the second switch block 36b are off.

The four amplifiers 37a of the amplifier block 37 are respectively connected to the four capacitors 39a of the capacitor block 39 via the third connector bus 38. In the amplifier block 37, one of the amplifier 37a that is an output for the fourth-order filter circuit, that is, the amplifier 37a that is located on the rightmost side of the figure, is provided with one output terminal 13c.

Here, each of the first switch block 36a and the second switch block 36b that constitute the resistor block-switching circuit 36 are connected to each signal input side of the amplifiers 37a of the amplifier block 37, which is the virtual ground point thereof.

In the filter circuit 13 for received signals thus configured, for example, normally all the switches 361 of the first switch block 36a are collectively in the on-state, and the resistors 31a of the first resistor block 31 are connected to the amplifiers 37a of the amplifier block 37. As a result, the first resistor block 31, the amplifier block 37, and the capacitor block 39 together form the first filter circuit 131, which is a fourth-order filter circuit and has a high cutoff frequency. The first filter circuit 131 is selected in cases where, for example, both the downstream data rate and the upstream data rate are fast.

By contrast, when a mode-selecting signal is input from the mode-selecting terminal 13b, the switches 362 of the second switch block 36b are collectively turned on and at the same time the switches 361 of the first switch block 36a are collectively turned off. As a result, the resistors 32a of the second resistor block 32 are connected to the amplifiers 37a of the amplifier block 37, and the second resistor block 32, the amplifier block 37, and the capacitor block 39 together form the second filter circuit 132, which is a fourth-order filter circuit and has a high cutoff frequency different from the cutoff frequency of the first filter circuit 131. The second filter circuit 132 is selected in cases where, for example, the downstream data rate is fast while the upstream data rate is slow.

Thus, the filter circuit 13 for received signals can select one of the first and the second filter circuits 131 and 132 having differing high cutoff frequencies.

Moreover, the first filter circuit 131 and the second filter circuit 132 share the amplifier block 37 and the capacitor block 39, and therefore, it is possible to reduce the circuit scale of the filter circuit 13 for received signals. In particular, the amplifier block 37 and the capacitor block 39, which are shared by the first filter circuit 131 and the second filter circuit 132, have a larger circuit scale than the first resistor block 31 and the second resistor block 32, and therefore, the circuit scale of the filter circuit 13 for received signals can be significantly reduced.

Furthermore, the resistor block-switching circuit 36 that switches between the first filter circuit 131 and the second filter circuit 132 is formed by the first switch block 36a and the second switch block 36b, and each of the first switch block 36a and the second switch block 36b is connected to the signal input side of the amplifier block 37, which is its virtual ground point thereof, meaning that they are not provided in the signal communication channel; therefore, they are not easily affected by voltage fluctuations, and as a consequence, it is possible to reduce distortion in the signal that is filtered.

The filter circuit 23 for transmitted signals has a similar circuit configuration to the filter circuit 13 for received signals shown in FIG. 3, but in the filter circuit 23 for transmitted signals, the first filter circuit 231 and the second filter circuit 232 are selectively formed that have low cutoff frequencies that are different from each other.

It should be noted that the above-described example illustrates a case where both the first filter circuit 131 and the second filter circuit 132 that are switched in the filter circuit 13 for received signals are fourth-order filter circuits; however, it is possible that either one of the first filter circuit 131 or the second filter circuit 132 that are selected in the filter circuit 13 for received signals may construct a third-order filter circuit.

Embodiment 2

In the following, a front end of a communication system according to Embodiment 2 of the present invention is described.

Figure 4:
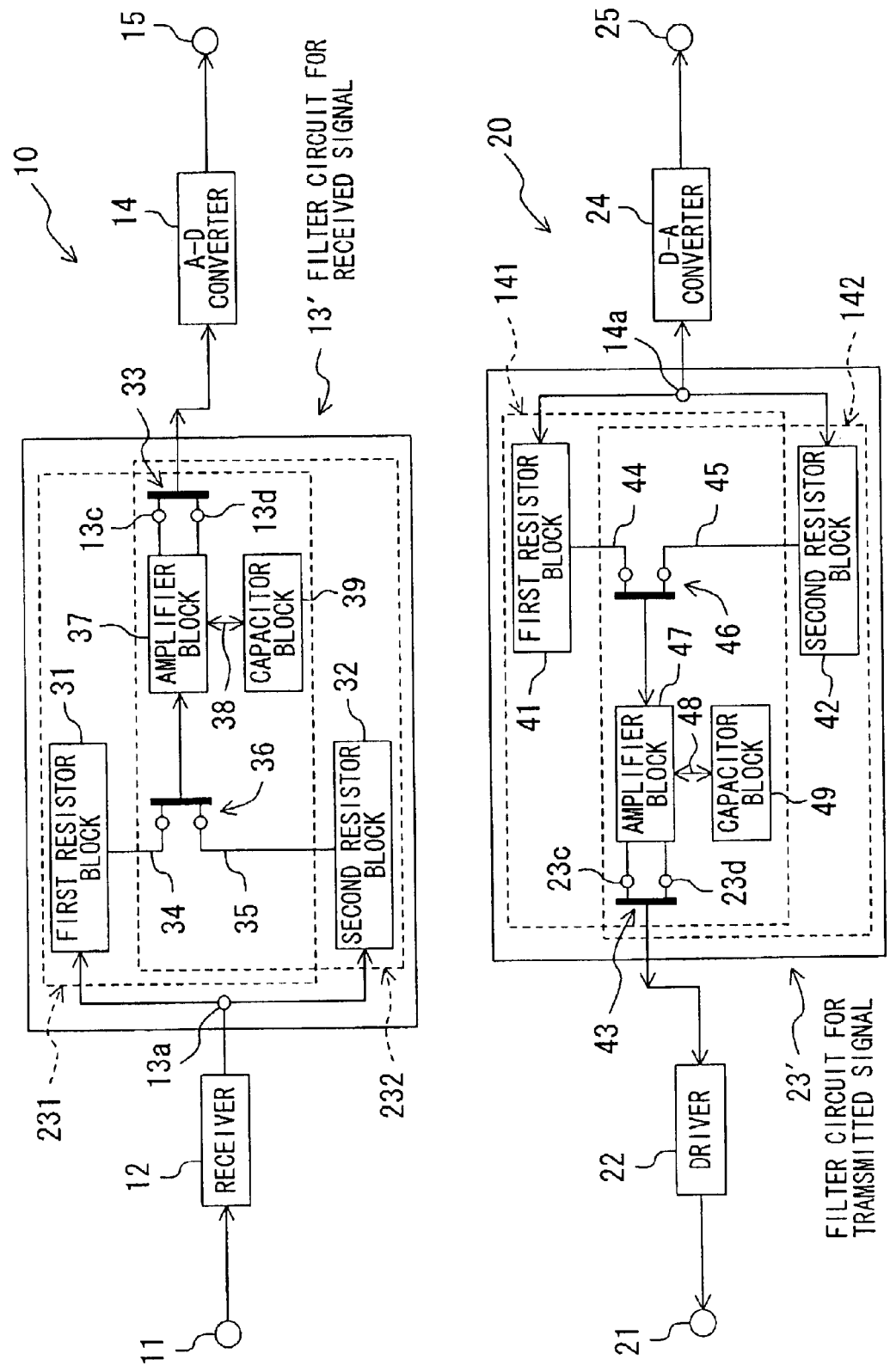
FIG. 4 is a block diagram showing a front end of a communication system according to Embodiment 2 of the present invention.

FIG. 4 shows the front end according to Embodiment 2 of the present invention. The present embodiment illustrates a configuration of a front end in which the first filter circuit 231 is a third-order filter circuit and the second filter circuit 232 is a fourth-order filter circuit. This front end has the same configuration as the front end shown in FIG. 1 except that the configurations of its filter circuit 13' for received signals and filter circuit 23' for transmitted signals are different.

Figure 5:
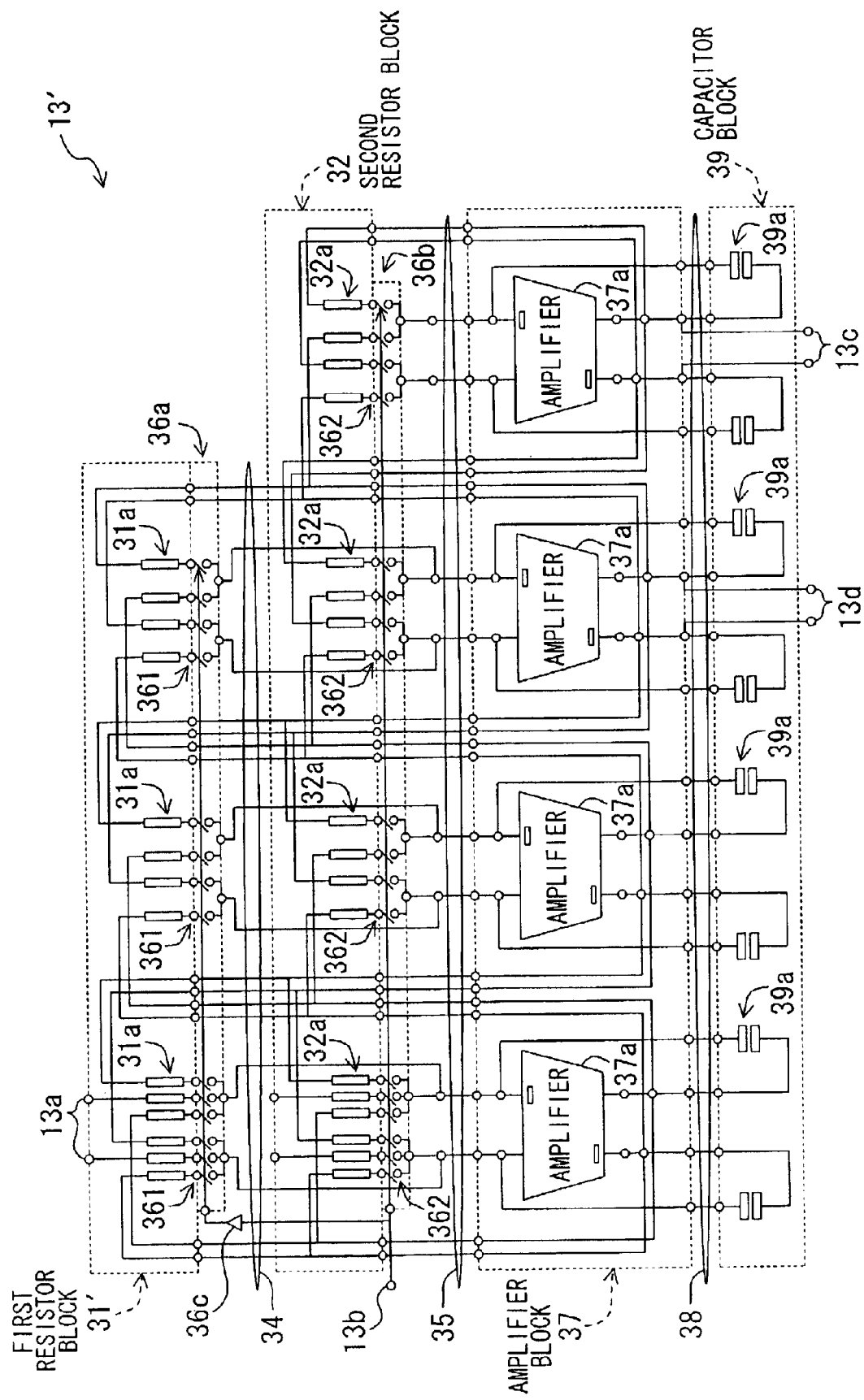
FIG. 5 is a circuit diagram showing the detailed configuration of a filter circuit for received signals used for the front end.

FIG. 5 is a circuit diagram showing the detailed configuration of the filter circuit 13' for received signals of the front end. As shown in the figure, in this filter circuit 13' for received signals, a first resistor block 31' has three resistors 31a that constitute part of the third-order (a first ordinal number) filter circuit, and in the amplifier block 37, one of the amplifier 37a that is an output for the third-order filter circuit, which is the amplifier 37a that is the third one from the left of FIG. 5, is provided with an output terminal 13d. Meanwhile, the second resistor block 32 has four resistors 32a, the number of which is different from the number of the three resistors 31a, which constitute the first resistor block 31, so that they constitute part of the fourth-order (a second ordinal number) filter circuit. In the amplifier block 37, one of the amplifier 37a that is an output for the fourth-order filter circuit, which is the amplifier 37a that is located on the rightmost side of FIG. 5, is provided with an output terminal 13c of the fourth-order filter circuit. The rest of the configuration is the same as the configuration of the filter circuit 13 for received signals shown in FIG. 3.

In addition, as shown in FIG. 4, the filter circuit 13 for received signals is also provided with an output terminal-switching circuit 38 for selecting, as the output terminal of the filter circuit 13', one of the output terminal 13c of the fourth-order filter circuit and the output terminal 13d of the third-order filter circuit to connect it to the A-D converter 14.

In the filter circuit 13 for received signals thus configured, when the switches 361 of the first switch block 36a are collectively turned on in the resistor block-switching circuit 36 so that the three resistors 31a of the first resistor block 31' are respectively connected to three of the amplifiers 37a of the amplifier block 37, the output terminal-switching circuit 33 selects the output terminal 13d as the output terminal of the third-order filter circuit. As a result, the first resistor block 31', the amplifier block 37, and the capacitor block 39 form a third-order filter circuit, and the output thereof is output from the output terminal 13d.

By contrast, when a mode-selecting signal is input from the mode-selecting terminal 13b, the switches 362 of the second switch block 36b are collectively turned on and, at the same time, the switches 361 of the first switch block 36a are collectively turned off. As a result, the four resistor 32a of the second resistor block 32 are respectively connected to the four amplifiers 37a of the amplifier block 37, forming a fourth-order filter circuit. Also, the output terminal-switching circuit 33 selects the output terminal 13c as the output terminal of the fourth-order filter circuit. Consequently, the output of the fourth-order filter circuit thus formed is output from the output terminal 13c.

The filter circuit 23' for transmitted signals shown in FIG. 4 also has a similar configuration to the filter circuit 13' for received signals shown in the same figure, and its amplifier block 47 is provided with two output terminals 23c and 23d. The filter circuit 23' for transmitted signals is, as shown in FIG. 5, provided with an output terminal-switching circuit 43 for selecting one of the two output terminals 23c and 23d to connect it with the driver 22.

In this filter circuit 23' for transmitted signals as well, one of the third-order filter circuit 141 or the fourth-order filter circuit 142 is selected by switching of the resistor block-switching circuit 46 and, at the same time, the output terminal-switching circuit 43 is also changed so that the output terminal 23d is selected when the third-order filter circuit 141 is formed whereas the output terminal 23c is selected when the fourth-order filter circuit 142 is formed.

Accordingly, the front end shown in FIG. 4 can selectively form filter circuits having differing ordinal numbers, and moreover, the outputs thereof can be selectively changed.

Embodiment 3

Embodiment 3 of the present invention is described below.

Figure 9:
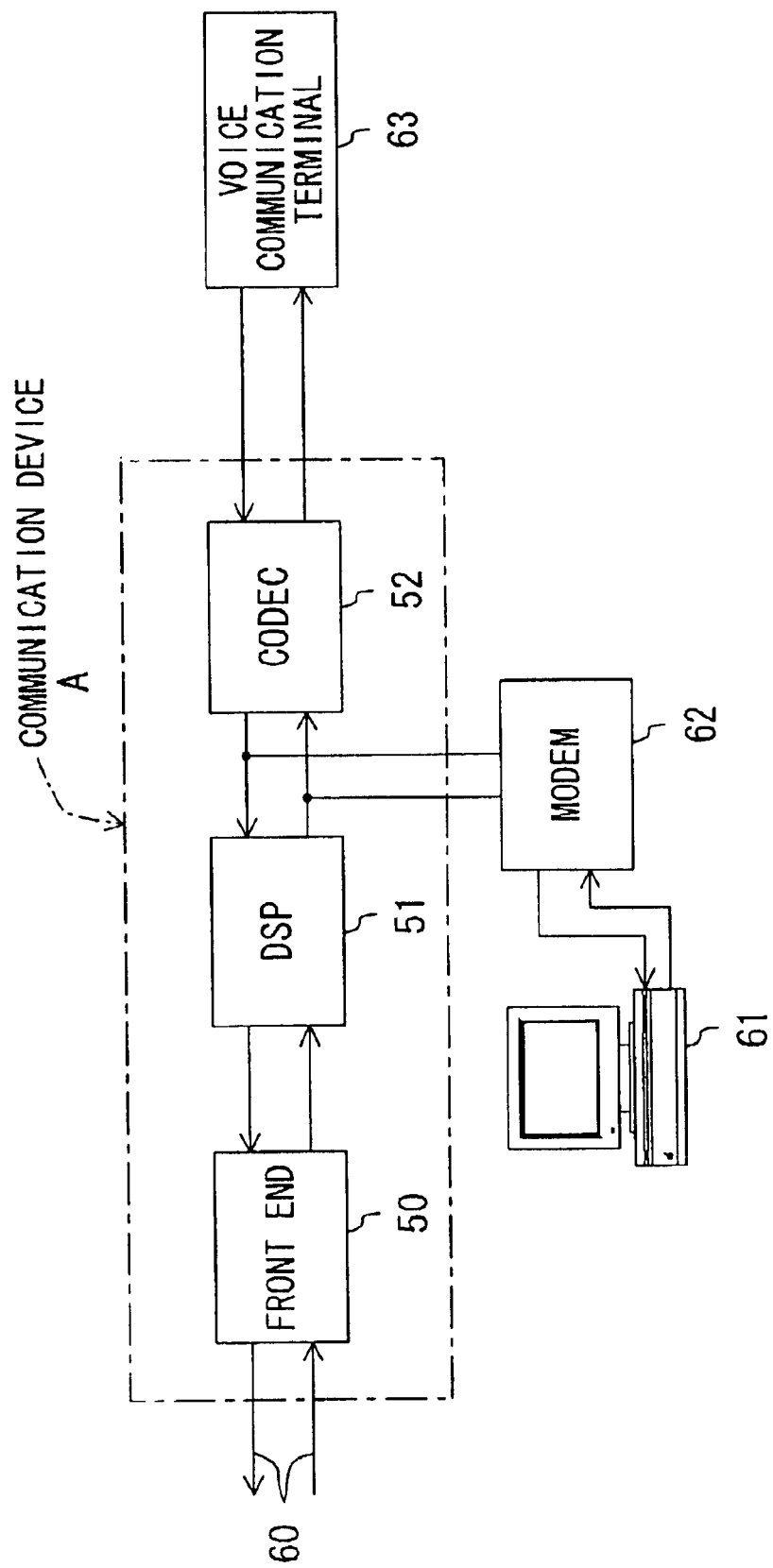
FIG. 9 is a block diagram schematically showing the overall configuration of a communication device according to Embodiment 3 of the present invention.

FIG. 9 shows the overall configuration of a communication device A comprising the above-described front end of an ADSL communication system. The communication device A shown in the figure comprises a front end 50 as shown in the previously described FIG. 1, a DSP (Digital Signal Processor) 51, and a CODEC 52. This communication device A is connected to a telephone line 60 for transmitting and receiving a voice signal and a data signal, is also connected to a data terminal device 61, such as a personal computer or the like, via an ADSL modem 62, and is further connected directly to a voice communication terminal 63, such as a telephone unit or the like.

The communication device outputs, to the voice communication terminal 63, a voice signal contained in a signal that comes through the telephone line 60 and is received by the front end 50, and it conversely transmits a voice signal that is input from the voice communication terminal 63 through the front end 50, using the telephone line 60. In addition, this communication device outputs, to the data communication terminal 61, a data signal contained in the signal that comes through the telephone line 60 and is received by the front end 50, and it conversely transmits a data signal from the data communication terminal 61 through the front end 50, using the telephone line 60. Specifically, the DSP (signal processing circuit) 51 encodes and decodes a multiplexed signal of the voice signal and the data signal in a predetermined manner of processing, and it performs error handing for the signal. The CODEC (converter circuit) 52 converts a digital voice signal from the DSP 51 into an analog voice signal and converts an analog voice signal from the voice communication terminal 63 into a digital voice signal. The ADSL modem 62 converts an ADSL data signal from the DSP 51 into a data signal and a data signal from the data terminal device 61 into an ADSL data signal.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A filter circuit comprising:
   an amplifier block including a plurality of amplifiers;

a capacitor block including a plurality of capacitors, the plurality of capacitors being connected to the plurality of amplifiers included in the amplifier block respectively;

a plurality of resistor blocks each block including a plurality of resistors; and a resistor block-switching circuit for selecting one of the plurality of resistor blocks and connecting the plurality of resistors included in the selected resistor block to the plurality of amplifiers included in the amplifier block, wherein:

a first resistor block of the plurality of resistor blocks has a plurality of resistors, the number of which is different from the number of resistors included in a second resistor block of the plurality of resistor blocks;

a first filter circuit in which the first resistor block is connected to the amplifier block constitutes a filter circuit having a first ordinal number; and a second filter circuit in which the second resistor block is connected to the amplifier block constitutes a filter circuit having a second ordinal number.

2. The filter circuit according to claim 1, wherein:

one of the plurality of amplifiers in the amplifier block that is an output of the first filter circuit is connected to a pair of output terminals of the filter circuit having the first ordinal number; and one of the plurality of amplifiers in the amplifier block that is an output of the second filter circuit is connected to a pair of output terminals of the filter circuit having the second ordinal number.

3. The filter circuit according to claim 2, further comprising an output terminal-switching circuit for selecting one of the pair of output terminals of the filter circuit of the first ordinal number and the pair of output terminals of the filter circuit of the second ordinal number.

4. The filter circuit according to claim 1, wherein the resistor block-switching circuit is arranged at signal input sides of the plurality of amplifiers included in the amplifier block, the signal input sides being the virtual ground point thereof.

5. A front end of a communication system, the front end having:

a filter circuit that filters signals, the filter circuit comprising:

an amplifier block including a plurality of amplifiers;

a capacitor block including a plurality of capacitors, the plurality of capacitors being connected to the plurality of amplifiers included in the amplifier block respectively;

a plurality of resistor blocks each including a plurality of resistors; and a resistor block-switching circuit for selecting one of the plurality of resistor blocks and connecting the plurality of resistors included in the selected resistor block to the plurality of amplifiers included in the amplifier block, wherein:

a first resistor block of the plurality of resistor blocks has a plurality of resistors, the number of which is different from the number of resistors included in a second resistor block of the plurality of resistor blocks;

a first filter circuit in which the first resistor block is connected to the amplifier block constitutes a filter circuit having a first ordinal number; and a second filter circuit in which the second resistor block is connected to the amplifier block constitutes a filter circuit having a second ordinal number.

6. The front end of a communication system according to claim 5, wherein the communication system is an asymmetric communication system in which an upstream data rate and a downstream data rate are different from each other.

7. The front end of a communication system according to claim 6, wherein the asymmetric communication system is an ADSL communication system.

8. The front end of a communication system according to claim 5, wherein:

the filter circuit comprises a first filter circuit for received signals and a second filter circuit for transmitted signals; and the first filter circuit and the second filter circuit are not electrically connected by signal wiring and a switch circuit, the first and the second filter circuits being electrically separated from each other.

9. The front end of a communication system according to claim 8, wherein the resistor block-switching circuit is arranged at signal input sides of the plurality of amplifiers included in the amplifier block, the signal input sides being the virtual ground point thereof.

10. The front end of a communication system according to claim 8, wherein:

a first resistor block of the plurality of resistor blocks that are included in each of the first filter circuit and the second filter circuit has a plurality of resistors, the number of which is different from the number of resistors included in a second resistor block of the plurality of resistor blocks;

a first filter circuit in which the first resistor block is connected to the amplifier block constitutes a filter circuit having a first ordinal number; and a second filter circuit in which the second resistor block is connected to the amplifier block constitutes a filter circuit having a second ordinal number.

11. A communication device comprising:

a front end having a filter circuit that filters signals, the filter circuit comprising:

an amplifier block including a plurality of amplifiers;

a capacitor block including a plurality of capacitors, the plurality of capacitors being connected to the plurality of amplifiers included in the amplifier block respectively;

a plurality of resistor blocks each including a plurality of resistors; and a resistor block-switching circuit for selecting one of the plurality of resistor blocks and connecting the plurality of resistors included in the selected resistor block to the plurality of amplifiers included in the amplifier block;

a signal processing circuit for digitally processing a signal received by the front end and a signal transmitted from the front end; and a converter circuit for converting the signal that has been digitally processed by the signal processing circuit into an analog signal and converting an analog signal that is input from a predetermined voice communication terminal to the signal processing circuit into a digital signal, wherein a first resistor block of the plurality of resistor blocks that are included in the filter circuit of the front end has a plurality of resistors, the number of which is different from the number of resistors included in a second resistor block of the plurality of resistor blocks;

a first filter circuit in which the first resistor block is connected to the amplifier block constitutes a filter circuit having a first ordinal number; and a second filter circuit in which the second resistor block is connected to the amplifier block constitutes a filter circuit having a second ordinal number.

12. The communication device according to claim 8, wherein a resistor block-switching circuit is arranged at signal input sides of a plurality of amplifiers included in the amplifier block, the signal input sides being the virtual ground point thereof.

* * * * *